United States Patent [19]
Zadrick et al.

[11] Patent Number: 5,263,632
[45] Date of Patent: Nov. 23, 1993

[54] APPARATUS FOR POSITIONING INTEGRATED CIRCUIT PACKAGES FOR TINNING

[75] Inventors: Wayne J. Zadrick; Carlo M. Faienza, both of Bristol; Robert P. Isherwood, Avon, all of Conn.

[73] Assignee: United Technologies Corporation, Hartford, Conn.

[21] Appl. No.: 926,584

[22] Filed: Aug. 6, 1992

[51] Int. Cl.⁵ ............................................. B23K 37/04
[52] U.S. Cl. .................................. 228/49.1; 228/260; 269/903
[58] Field of Search ................ 228/49.1, 44.7, 260, 228/47, 254; 269/903

[56] References Cited

U.S. PATENT DOCUMENTS

| | | | |
|---|---|---|---|
| 4,700,935 | 10/1987 | Winslow et al. | 269/903 |
| 4,747,532 | 5/1988 | Sim | 269/903 |
| 4,871,106 | 10/1989 | Wharff | 269/903 |

FOREIGN PATENT DOCUMENTS 2495884  6/1982  France ................................ 228/47

*Primary Examiner*—Mark Rosenbaum
*Assistant Examiner*—Jeffrey T. Knapp

[57] ABSTRACT

A fixture for positioning high density packaged integrated circuits for tinning which includes a clamp bar assembly pivotally attached to a base. The base includes recessed nests in which the high density packages are positioned. The high density packages are secured in the nests by the clamp bar assembly. The top surfaces of the high density packages are protected from the solder wave by the base. A predetermined spacing and orientation of the nests ensures proper tinning.

10 Claims, 2 Drawing Sheets

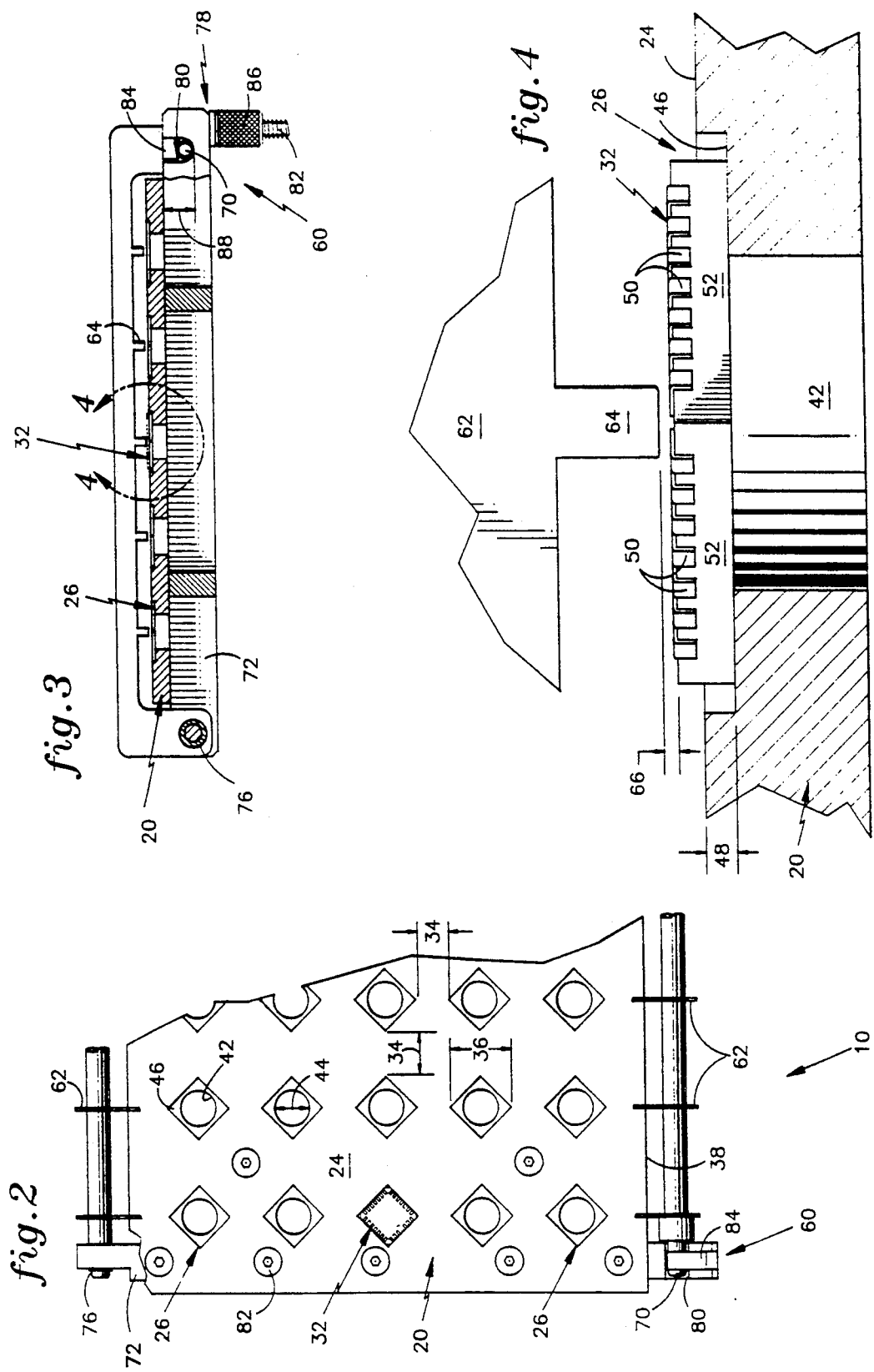

APPARATUS FOR POSITIONING INTEGRATED CIRCUIT PACKAGES FOR TINNING

TECHNICAL FIELD

This invention relates to apparatus for tinning integrated circuit packages, and more particularly to apparatus for positioning high density integrated circuit packages for solder flow tinning operations.

BACKGROUND ART

The continuous miniaturization of integrated circuit ("IC") dies has resulted in the cluster packaging of plural dies within single high density IC packages ("HDPs"). The die input/output ("I/O") leads are arrayed along the perimeter of the HDP to facilitate the electrical connection of the dies to external circuitry, such as that found on a printed circuit board ("PCB"). The HDP leads must be coated with solder, i.e., "tinned", in preparation for mounting on the PCB. After tinning, the HDP can be mounted to the surface of a PCB by melting the tinned solder onto copper pads on the PCB with infra red radiation.

It is known in the art to use mechanical means to hold HDPs in a fixture for tinning the leads in a wave soldering machine. The typical prior art fixtures include a base adapted to receive a plurality of HDPs positioned in a matrix array, and a clamping mechanism that secures the HDPs to the base. The fixture may be constructed of titanium or fluorocarbon polymer coated metal.

The base portion of these prior art fixtures is an orthogonal grid structure. The grid allows molten solder to flow through the structure and contact the top or "case" of the HDPs. Consequently, solder will adhere to HDPs with metallic cases, producing visual scrap or, by covering the part marking, render the HDP unidentifiable.

Similarly, the clamping mechanism of the prior art fixtures which utilize mechanical means to hold HDPs may interfere with the natural flow of solder in the wave soldering machine, in a phenomenon known as "shadowing." This shadowing may cause solder balls, uneven coating of solder, and failure of solder to adhere to the HDP leads.

DISCLOSURE OF THE INVENTION

An object of the present invention is to provide a fixture that prevents molten solder from contacting the cases of the HDPs.

Another object is to provide a fixture that eliminates shadowing and enhances solderability.

According to the present invention, a tinning fixture comprises a clamping mechanism and a solid base shield structure with mounting locations bored therein to receive the HDP devices in a juxtaposed matrix designed to minimize the shadowing effect and also to protect the HDP case from solder splash. In further accord with the present invention, the base mounting locations are bored through the base shield to permit convective cooling of each HDP case. In still further accord with the present invention, the clamping mechanism comprises a grate-like structure of parallel blades, one for each column of mounting locations in the base matrix, each blade presenting a streamlined profile to the solder flow, thereby further minimizing the opportunities for flow disturbances and shadowing.

The base of the present invention protects HDPs with metallic cases. Whereas prior art mechanical means systems allowed molten solder to flow through their orthogonal grid base, the base of the present invention does not allow molten solder to flow through. Thus, the cases of the HDPs are protected and their part markings are not obscured. Ventilation holes in the base can be used to prevent damage to the part markings caused by contact with the heated base. The present invention can also be used on ceramic and plastic packages.

The present invention eliminates shadowing with its unique, streamlined clamping mechanism in conjunction with particular HDP spacing and orientation. The clamping mechanism does not substantially interfere with the natural flow of the solder wave while holding the HDP securely in place. The HDP spacing and orientation reduce interference with the natural flow of solder caused by the HDP itself. By lowering the overall interference with the flow of the solder wave, proper tinning is assured.

The present invention is more durable and less costly to manufacture than prior art systems because of its unique fabrication. The entire fixture is fabricated of series 300 stainless steel, including one or more of the following: types 301, 302, 303, 316, 316L, 321, and 347 stainless steel. Series 300 stainless steel is more durable than fluorocarbon polymer coated metals and less costly to buy and machine than titanium. Such stainless steel will resist adhesion of solder substantially as well as fluorocarbon polymer and titanium. Of course, the present invention could be fabricated of fluorocarbon polymer coated metal or titanium.

These and other objects, features, and advantages of the present invention will become more apparent in light of the following detailed description thereof, as illustrated in the accompanying drawing.

BRIEF DESCRIPTION OF THE DRAWING

FIG. 2 is a plan view, partly broken away and partly in section, of the embodiment of FIG. 1.

FIG. 3 is a sectional view taken along the line 3—3 of FIG. 1.

FIG. 4 is an enlarged view taken along the line 4—4 of FIG. 3.

BEST MODE FOR CARRYING OUT THE INVENTION

Figure 1:
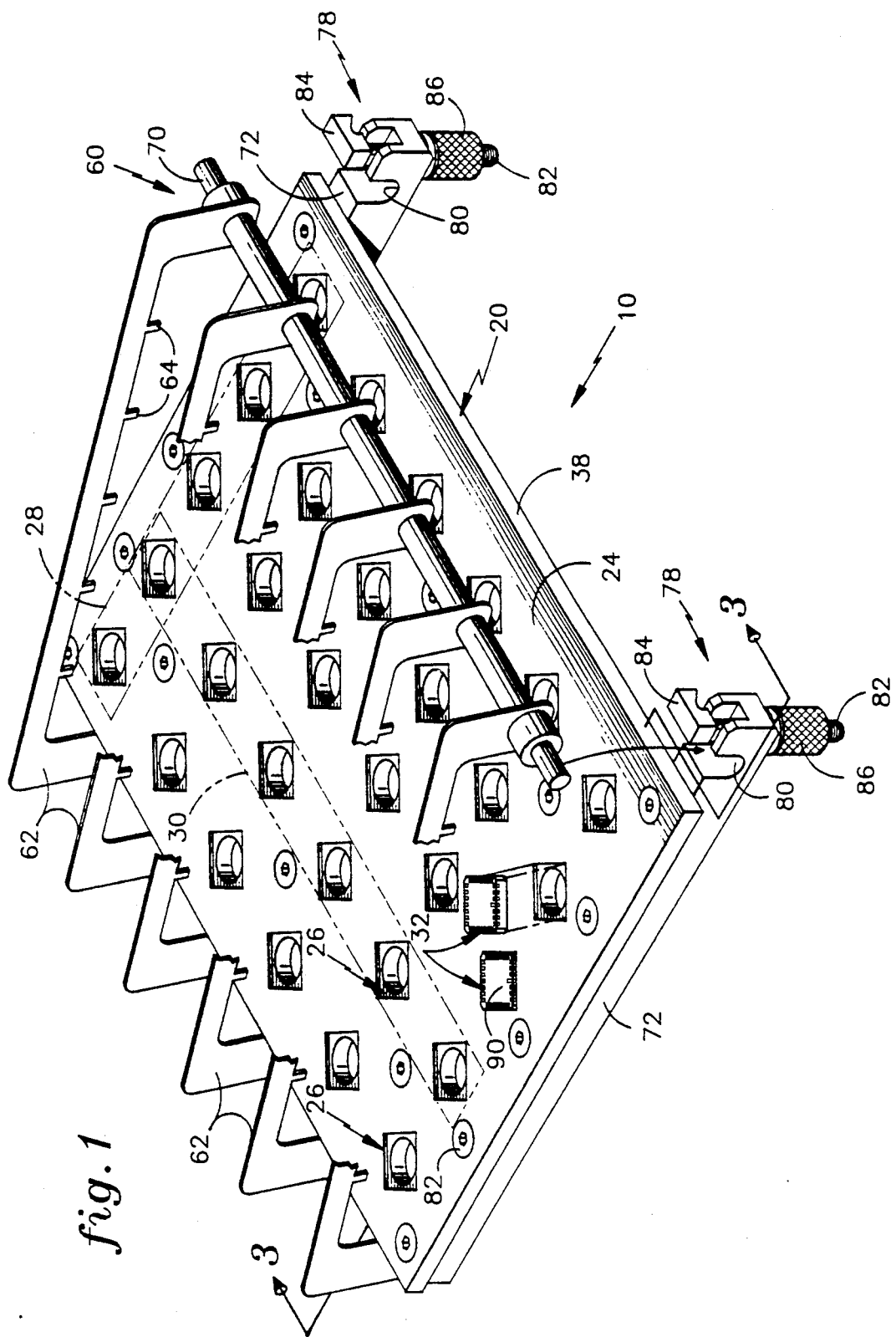
FIG. 1 is a perspective, partially broken away view of a best mode embodiment of the present invention.

FIG. 1 illustrates one embodiment of a fixture 10 according to the present invention. The fixture 10 is comprised of a base 20 and a clamp bar assembly 60. The base 20 is a solid shield with a working surface 24 adapted to be exposed to a solder wave (not illustrated). Because the base 20 is solid, solder can not flow from the working surface 24 of the base 20 to a protected surface (not specifically illustrated) which is opposite to the working surface 24. The base 20 is fabricated of material to which solder will not adhere, such as type 303 stainless steel. The base 20 includes a plurality of recessed nests 26, arrayed in columns 28 and rows 30, which have rectangular footprints adapted to accept an HDP 32.

FIG. 2 illustrates the orientation and spacing 34 of the nests 26. The orientation of the nests 26 is such that diagonal dimension 36 of each nest 26 is aligned along an axis which is perpendicular to a leading edge 38 of the base 20 which is the first portion of the fixture 10 to contact the solder wave. The spacing 34 between adjacent nests 26 is not less than the diagonal dimension 36 of each nest 26.

Each nest 26 includes a ventilation hole 42 with a diameter 44. The diameter 44 is determined by the dimensions of the HDP 32 that will be positioned in the nest 26. The diameter 44 should be large enough so that there is minimal contact between the base 20 and the HDP 32, i.e., a minimal lip 46 area. However, the diameter 44 must not be so great that the lip 46 is eliminated. The ventilation hole 42 extends completely through the base 20.

FIG. 4 illustrates a depth 48 of each nest 26 which is the distance between the working surface 24 of the base 20 and the lip 46. The depth 48 is determined by the dimensions of the HDP 32 that will be positioned in the nest 26. A plurality of leads 50 come out of the HDP 32 on each side 52 and follow the contour of the HDP 32 around to a bottom (not specifically illustrated). The exposed portion of the HDP 32 includes the leads 50 to be tinned and the protected portion of the HDP 32 does not include leads 50. Since the entire surface of each lead 50 must be tinned, the depth 48 must be shallow enough that the leads 50 can not touch the working surface 24. However, the depth 48 must also be deep enough that the HDP 32 can not slide along the plane of the working surface 24 of the base 20 out of the nest 26.

Referring now to FIG. 1, the clamp bar assembly 60 includes a plurality of thin blades 62 with fingers 64 disposed thereon. At least one blade 62 exists for each column 28 of nests 26. When viewed from above, as in FIG. 2, the blades 62 bisect the nests 26. The fingers 64 are disposed on the blade 62 in such a way that they protrude outwardly from the blade 62 toward the center of each nest 26 with the clamp bar assembly 60 in a closed position (compare FIG. 3 to FIG. 1). Thus, each finger 64 has an associated HDP 32. Both the fingers 64 and the blades 62 are fabricated of material to which solder will not adhere, such as type 301 stainless steel.

FIG. 4 illustrates a space 66 between the finger 64 and its associated HDP 32. To protect the HDP 32 from damage, the finger 64 should not force the HDP 32 into the nest 26. There is, therefore, some minimal space 66 between the finger 64 and its associated HDP 32. The space 66 is determined by the dimensions of the HDP 32 that will be positioned in the nest 26. The space 66 must be large enough that the HDP 32 is not under pressure from the finger 64, i.e., no contact with the finger 64 when the clamp bar assembly 60 (FIG. 1) is in the closed position. However, the space 66 should be small enough so that the HDP 32 can not fall out of the nest 26 when the fixture 10 (partially illustrated in FIG. 4) is inverted. As a general rule, the space 66 must be smaller than the depth 48 of the nest 26.

Referring now to FIGS. 2 & 3, the clamp bar assembly 60 includes means for pivotally connecting the blades 62 to the base 20. A rod 70 is attached to corresponding ends of each blade 62. Thus, all of the blades 62 are bound together by means of the rod 70. A plurality of bars 72 are attached to the base 20 in such a way that the base 20 is disposed between the bars 72 and the blades 62. The bars 72 prevent the base 20 from warping in the high temperature environment of the tinning operation. The bars 72 may be attached to the base 20 by means such as a plurality of bolts 82 (FIG. 2 only). Each bar 72 has a hinge 76 attached on one end. The hinge 76 is also attached to the corresponding ends of the blades 62 opposite to the rod 70. Thus, the blades 62 and the base 20 are pivotally attached by means of the bars 72 and the hinge 76.

Referring now to FIG. 3, the clamp bar assembly 60 includes at least one positive lock clamp (PLC) 78. The PLC 78 is attached to the bar 72 on the end opposite the hinge 76. The PLC 78 is operative to secure the rod 70, and thus the blades 62, in the closed position. The PLC 78 includes a slot 80 in the bar 72. The slot 80 is configured to accept the rod 70 and thereby limit a range of travel of the rod 70. A bolt 82 with a shoulder 84 extending outwardly over the slot 80 can be tightened by means of a nut 86, thereby securing the rod 70 in the closed position. Because the range of travel of the rod 70 is limited by a depth 88 of the slot 80, the pivotal range of the blades 62 is determined by the depth 88 of the slot 80. Thus, the depth 88 can be set in such a way that the fingers 64 will never exert pressure on the HDPs 32.

Referring now to FIG. 1, In normal operation, the HDPs 32 are placed in the nests 26 with a bottom surface 90 of the HDPs 32 facing outwardly toward the blades 62. The blades 62 are then closed by hand and locked in place with the respective PLCs 78. At this point the entire fixture 10 is inverted and placed in a wave soldering machine (not illustrated). For tinning in the wave soldering machine, the orientation of the fixture 10 should be such that the blades 62 are below the base 20.

It should be understood that the invention is not limited to the particular embodiments shown and described herein, but that various changes and modifications may be made without departing from the spirit and scope of this novel concept as defined in the following claims.

What is claimed is:

1. A fixture for positioning one or more high density packages for tinning in a solder wave, comprising:
   a solid base having a leading edge, said base including a plurality of adjacent nests configured for mounting the high density packages, each said nest having a rectangular footprint and a diagonal dimension wherein said diagonal dimension is aligned along an axis which is perpendicular to said leading edge; and
   a clamp bar assembly, pivotally attached to said base, for securing the high density packages to said base.

2. The fixture of claim 2 wherein each said nest includes a ventilation hole.

3. The fixture of claim 1 wherein said adjacent nests are spaced apart a predetermined distance, said predetermined distance being not less than said diagonal dimension.

4. The fixture of claim 1 wherein said clamp bar assembly includes a plurality of thin blades, each said thin blade including a plurality of fingers.

5. The fixture of claim 1 wherein said clamp bar assembly includes at least one positive lock clamp.

6. The fixture of claim 1 wherein said base is fabricated of a material selected from the group consisting of type 301 stainless steel, type 302 stainless steel, type 303 stainless steel, type 316 stainless steel, type 316L stainless steel, type 321 stainless steel, type 347 stainless steel, titanium, and fluorocarbon polymer coated metal.

7. The fixture of claim 1 wherein said clamp bar assembly is fabricated of a material selected from the group consisting of type 301 stainless steel, type 302 stainless steel, type 303 stainless steel, type 316 stainless steel, type 316L stainless steel, type 321 stainless steel, type 347 stainless steel, titanium, and fluorocarbon polymer coated metal.

8. A fixture for positioning one or more high density packages for tinning in a solder wave, comprising:

a solid base having a leading edge, said base including a plurality of nests configured for mounting the high density packages, said nests having a rectangular footprint and a diagonal dimension, said diagonal dimension being aligned along an axis which is perpendicular to said leading edge; and a clamp bar assembly including a plurality of thin blades, each said blade having a plurality of fingers disposed thereon, a hinge, a rod, a plurality of bars, and a plurality of positive lock clamps, said thin blades being attached to said rod and pivotally attached to said bars by said hinge and said bars being attached to said base, said clamp bar assembly thereby being pivotally attached to said base, and further wherein each said positive lock clamp is attached to corresponding ones of said bars, said base thereby being securable to said clamp bar assembly.

9. The fixture of claim 8 wherein said base is fabricated of a material selected from the group consisting of type 301 stainless steel, type 302 stainless steel, type 303 stainless steel, type 316 stainless steel, type 316L stainless steel, type 321 stainless steel, type 347 stainless steel, titanium, and fluorocarbon polymer coated metal.

10. The fixture of claim 8 wherein said clamp bar assembly is fabricated of a material selected from the group consisting of type 301 stainless steel, type 302 stainless steel, type 303 stainless steel, type 316 stainless steel, type 316L stainless steel, type 321 stainless steel, type 347 stainless steel, titanium, and fluorocarbon polymer coated metal.

* * * * *